US010948372B2

(12) United States Patent
Arndt et al.

(10) Patent No.: US 10,948,372 B2
(45) Date of Patent: Mar. 16, 2021

(54) DUAL PRESSURE SENSING MODULE WITH A SHARED ELECTRICAL SUBSTRATE

(71) Applicant: Apple Inc., Cupertino, CA (US)

(72) Inventors: Gregory B. Arndt, San Jose, CA (US); Krishna Prasad Vummidi Murali, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 314 days.

(21) Appl. No.: 16/145,708

(22) Filed: Sep. 28, 2018

(65) Prior Publication Data

US 2020/0103302 A1    Apr. 2, 2020

(51) Int. Cl.
*G01L 19/14* (2006.01)
*B81B 7/00* (2006.01)
*G01L 9/00* (2006.01)
*G01L 19/00* (2006.01)
*G01L 9/06* (2006.01)

(52) U.S. Cl.
CPC .......... *G01L 19/147* (2013.01); *B81B 7/0061* (2013.01); *G01L 9/0054* (2013.01); *G01L 9/065* (2013.01); *G01L 19/0061* (2013.01); *G01L 19/148* (2013.01); *B81B 2201/0264* (2013.01); *B81B 2207/07* (2013.01)

(58) Field of Classification Search
None
See application file for complete search history.

(56) References Cited

U.S. PATENT DOCUMENTS

| | | | | |
|---|---|---|---|---|
| 5,437,189 A | * | 8/1995 | Brown | G01L 9/0055 73/708 |
| 7,305,888 B2 | * | 12/2007 | Walchli | G01L 9/0079 73/714 |
| 7,698,950 B2 | * | 4/2010 | Kraatz | G01L 19/148 73/708 |
| 8,922,380 B2 | * | 12/2014 | O'Connor | A61M 5/14244 340/626 |
| 9,608,297 B2 | * | 3/2017 | van Lammeren | H01M 10/445 |
| 9,737,657 B2 | * | 8/2017 | Miesel | G01L 19/086 |
| 2017/0067790 A1 | | 3/2017 | Takeuchi | |

* cited by examiner

*Primary Examiner* — Harshad R Patel
*Assistant Examiner* — Nigel H Plumb
(74) *Attorney, Agent, or Firm* — Brownstein Hyatt Farber Schreck, LLP (57) ABSTRACT

A pressure sensing module for an electronic device includes a substrate and a module housing coupled to the substrate. The module housing defines a first chamber and a second chamber. The second chamber is separate from the first chamber. The first chamber is configured to connect to an environment around an electronic device. The second chamber is configured to connect to an internal volume of the housing of the electronic device. A first pressure sensing element is electrically coupled to the substrate and disposed in the first chamber and is operative to detect an external pressure around the electronic device. A second pressure sensing element is electrically coupled to the substrate and disposed in the second chamber and is operative to detect an internal pressure within the electronic device housing.

20 Claims, 12 Drawing Sheets

DUAL PRESSURE SENSING MODULE WITH A SHARED ELECTRICAL SUBSTRATE

FIELD

The described embodiments relate generally to pressure sensors. More particularly, the present embodiments relate to a dual pressure sensing module that shares an electrical substrate.

BACKGROUND

Many electronic devices include pressure sensors. For example, an electronic device may include an external pressure sensor. The external pressure sensor may be connected to an external environment around the electronic device and may be operative to measure the pressure of the external environment (i.e., the ambient pressure around the electronic device). By way of another example, an electronic device may include an internal pressure sensor. The internal pressure sensor may be connected to an internal volume defined within the electronic device and may be operative to measure the pressure of the internal volume.

SUMMARY

The present disclosure relates to a dual pressure sensing module with a shared electrical substrate. The module includes a substrate and at least one module housing coupled to the substrate. The at least one module housing defines a first chamber and a second chamber. The second chamber is separate from the first chamber. The first chamber is configured to connect to an environment around an electronic device. The second chamber is configured to connect to an internal volume of the housing of the electronic device. A first pressure sensing element is electrically coupled to the substrate and disposed in the first chamber and is operative to detect an external pressure around the electronic device. A second pressure sensing element is electrically coupled to the substrate and disposed in the second chamber and is operative to detect an internal pressure within the electronic device housing. In this way, a single module is operative to detect external and internal pressures while sharing an electrical substrate and keeping the external and internal pressures separate.

In some embodiments, an electronic device includes an electronic device housing that defines an aperture and a pressure sensing module coupled to the electronic device housing around an aperture. The pressure sensing module includes a substrate, at least one module housing coupled to the substrate, a first pressure sensing element, and a second pressure sensing element. The at least one module housing defines a first chamber connected to the aperture and a second chamber separate from the first chamber. The first pressure sensing element is electrically coupled to the substrate and disposed in the first chamber and is operative to detect an external pressure around the electronic device. The second pressure sensing element is electrically coupled to the substrate and disposed in the second chamber and is operative to detect an internal pressure within the electronic device housing. In numerous examples, the first pressure sensing element and the second pressure sensing element are microelectromechanical system pressure sensors.

In various examples, a gel is positioned in the first chamber. In numerous examples, a water resistant membrane is coupled to the at least one module housing. The water resistant membrane resists passage of contaminants into the first chamber. In some examples, a seal is positioned between the electronic device housing and the at least one module housing around the first chamber. In various implementations of such examples, the seal separates the second chamber from an external environment around the electronic device.

In various embodiments, a pressure sensing module for an electronic device includes a substrate having a first surface and a second surface opposing the first surface; a first housing coupled to the first surface and defining a first chamber configured to be connected to an environment around the electronic device; and a first pressure sensing element, electrically coupled to the substrate via the first surface within the first chamber, operative to detect an external pressure of the environment. The pressure sensing module also includes a second housing coupled to the second surface and defining a second chamber configured to be connected to an internal volume of the electronic device and a second pressure sensing element, electrically coupled to the substrate via the second surface within the second chamber, operative to detect an internal pressure of the internal volume.

In some examples, the pressure sensing module further includes an integrated circuit, coupled to the substrate, that processes signals from the first pressure sensing element and the second pressure sensing element. In various implementations of such examples, the integrated circuit is coupled to the first surface and the first pressure sensing element is coupled to the first surface via the integrated circuit. In some implementations of such examples, the integrated circuit is coupled to the second surface and the second pressure sensing element is coupled to the first surface via the integrated circuit. In numerous implementations of such examples, the integrated circuit is configured to at least convert the signals from analog to digital, compensate the signals for temperature, or amplify the signals.

In various examples, the substrate includes a conductor that extends from the first surface to the second surface. In some examples, the substrate is ceramic.

In some embodiments, a pressure sensing module for an electronic device includes a substrate having a surface and defining a passage through the substrate; a housing coupled to the surface and defining a first chamber configured to be connected to a first environment via the passage and a second chamber configured to be connected to a second environment; a first pressure sensing element, coupled to the surface, operative to detect a first pressure of the first environment; and a second pressure sensing element, coupled to the surface, operative to detect a second pressure of the second environment. In some examples, either the first environment is an environment around the electronic device and the second environment is an internal volume of the electronic device or the first environment is the internal volume and the second environment is the environment around the electronic device.

In some examples, the housing defines an aperture that connects the second chamber to the second environment. In various examples, the housing includes a wall, coupled to the surface, that separates the first chamber from the second chamber. In numerous examples, the housing has a first surface that couples to the surface of the substrate, has a second surface opposite the first surface, and defines an aperture in the second surface that is configured to connect the second chamber to the second environment.

In various examples, the first pressure sensing element is positioned over the passage. In some implementations of such examples, the pressure sensing module further includes an integrated circuit, coupled to the surface over the first pressure sensing element, that is electrically connected to the first pressure sensing element and the second pressure sensing element. In numerous examples, the surface is a first surface; the substrate includes a second surface opposite the first surface; and the pressure sensing module further includes an integrated circuit, coupled to the second surface, that is electrically connected to the first pressure sensing element and the second pressure sensing element.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

The description that follows includes sample systems, methods, and computer program products that embody various elements of the present disclosure. However, it should be understood that the described disclosure may be practiced in a variety of forms in addition to those described herein.

An electronic device may include both an external pressure sensor and an internal pressure sensor. The external pressure sensor may measure the pressure of the external environment around the electronic device while the internal pressure sensor may measure the internal pressure of an internal volume defined by the external device. For example, an electronic device may use an external pressure sensor to determine the pressure of the external environment for use in health information calculations and the internal pressure sensor to determine when force exerted on a cover glass causes fluctuations in the internal pressure of the internal volume.

In some cases, external and internal pressures may be sensed using separate sensor modules. This may enable a module including an external pressure sensor to be connected to the external environment separately from another module including an internal pressure sensor connected to the internal volume.

However, using multiple modules in an electronic device in order to measure external and internal pressure consumes space within the electronic device. Further, using multiple modules increases expense. Particularly given that some components of the multiple modules may be redundant, a single module that is operative to measure both external and internal pressures may be an improvement.

The following disclosure relates to a dual pressure sensing module with a shared electrical substrate. The module includes a substrate and at least one module housing coupled to the substrate. The at least one module housing defines a first chamber and a second chamber. The second chamber is separate from the first chamber. The first chamber is configured to connect to an environment around an electronic device. The second chamber is configured to connect to an internal volume of the housing of the electronic device. A first pressure sensing element is electrically coupled to the substrate and disposed in the first chamber and is operative to detect an external pressure around the electronic device. A second pressure sensing element is electrically coupled to the substrate and disposed in the second chamber and is operative to detect an internal pressure within the electronic device housing. In this way, a single module is operative to detect external and internal pressures while sharing an electrical substrate and keeping the external and internal pressures separate.

In some embodiments, the at least one module housing may define the first and second chambers on opposing surfaces of the substrate. For example, the at least one module housing may include a first housing that defines the first chamber on a first surface of the substrate and a second housing that defines the second chamber on a second surface of the substrate opposite the first surface. The first housing may be configured to connect the first chamber to an environment around an electronic device via an aperture in the housing of the electronic device. A first pressure sensing element may be electrically coupled to the first surface and may be operative to detect an external pressure of the environment. The second housing may be configured to connect the second chamber to an internal volume within the housing of the electronic device. A second pressure sensing element may be electrically coupled to the second surface and may be operative to detect an internal pressure of the internal volume.

In various embodiments, the at least one module housing may define the first and second chambers on the same surface of the substrate. For example, the at least one module housing may define a first chamber and a second chamber on a surface of the substrate. The module housing may separate the two chambers, such as via a wall or other structure coupled to the substrate that divides and isolates the two chambers from each other. The module housing may be configured to connect the first chamber to a first environment via a passage through the substrate. A first pressure sensing element may be coupled to the surface and may be operative to detect a first pressure of the first environment. The module housing may also be configured to connect the second chamber to a second environment. A second pressure sensing element may be coupled to the surface and/or other portion of the substrate and may be operative to detect a second pressure of the second environment. The first environment may be an environment around the electronic device and the second environment may be an internal volume within the electronic device. Alternatively, the first environment may be the internal volume and the second environment may be the environment around the electronic device.

These and other embodiments are discussed below with reference to FIGS. 1A-11. However, those skilled in the art will readily appreciate that the detailed description given herein with respect to these Figures is for explanatory purposes only and should not be construed as limiting.

Figure 1A:
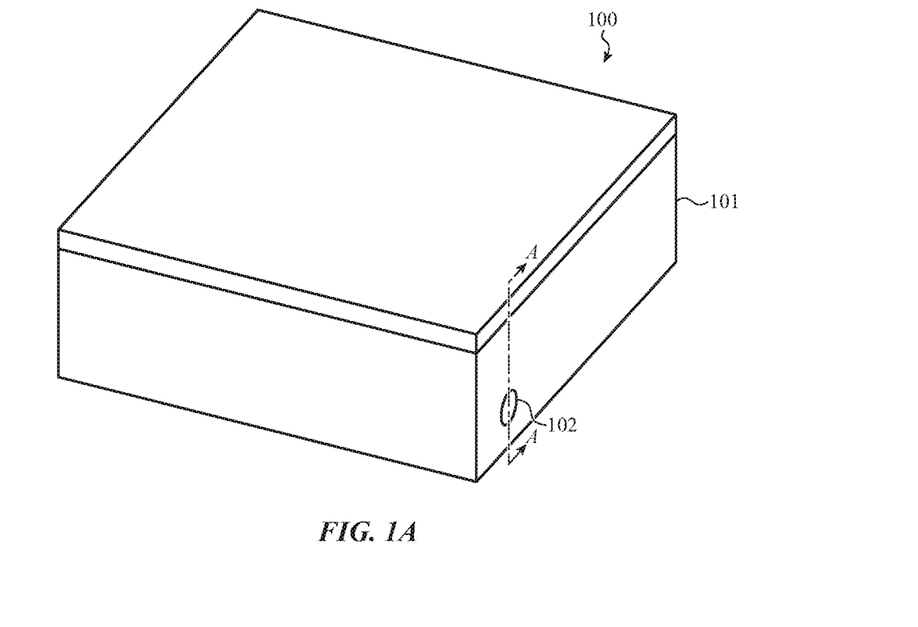
FIG. 1A depicts an example of a first electronic device that includes a dual pressure sensing module with a shared electrical substrate.
Figure 1B:
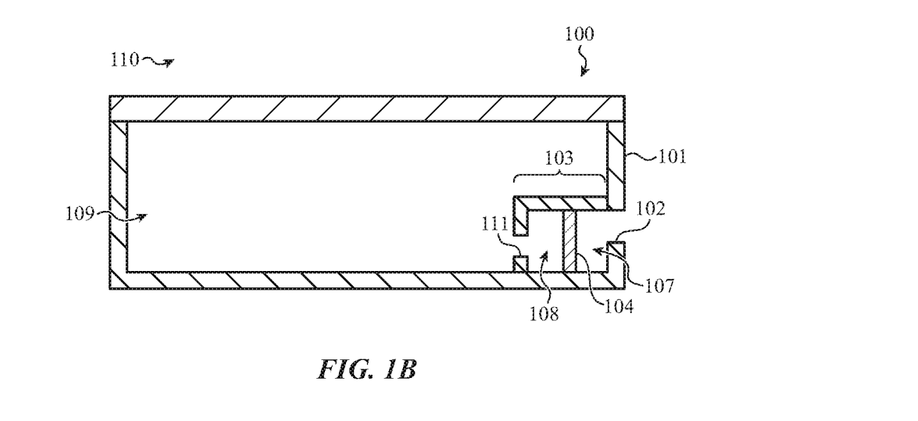
FIG. 1B depicts an example cross-section of the electronic device of FIG. 1A, taken along line A-A of FIG. 1A.

FIG. 1A depicts an example of a first electronic device 100 that includes a dual pressure sensing module with a shared electrical substrate. The electronic device 100 includes a housing 101. The housing 101 defines an aperture 102. FIG. 1B depicts an example cross-section of the electronic device 100 of FIG. 1A, taken along line A-A of FIG. 1A, illustrating a pressure sensing module 103.

The pressure sensing module 103 is disposed within the housing 101. The pressure sensing module 103 is connected to an external environment 110 around the electronic device 100 via the aperture 102 in the housing 101. The pressure sensing module 103 is also connected to an internal volume 109 defined by the housing 101. As shown the pressure sensing module 103 is connected to the internal volume 109 via an aperture 111 defined by the pressure sensing module 103.

The pressure sensing module 103 includes a substrate 104 and defines a first chamber 107 and a second chamber 108. In this example, the substrate 104 separates the first chamber 107 from the second chamber 108. The first chamber 107 is connected to the external environment 110 via the aperture 102. The second chamber 108 is connected to the internal volume 109 via the aperture 111.

The pressure sensing module 103 may include at least a first pressure sensing element (not shown) and a second pressure sensing element (not shown) electrically coupled to the substrate 104. The first pressure sensing element may be operative to detect the pressure of the external environment 110. The second pressure sensing element may be operative to detect the pressure of the internal volume 109.

In this example, the housing 101 functions as a portion of the pressure sensing module 103. However, it is understood that this is an example. Various configurations are possible and contemplated without departing from the scope of the present disclosure.

Figure 2A:
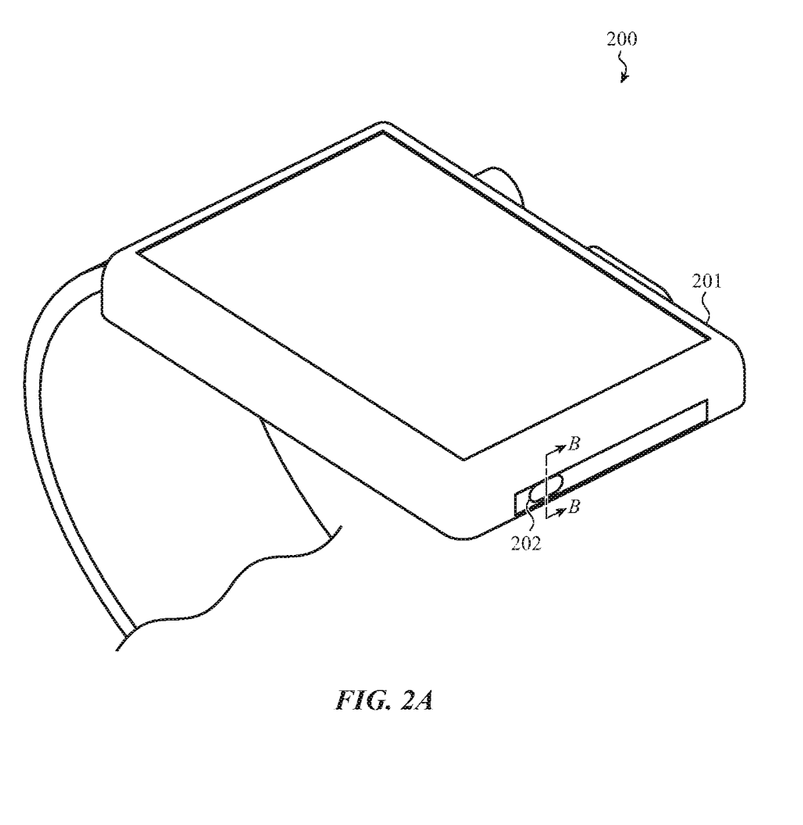
FIG. 2A depicts an example of a second electronic device that includes a dual pressure sensing module with a shared electrical substrate.

FIG. 2A depicts an example of a second electronic device 200 that includes a dual pressure sensing module with a shared electrical substrate. The electronic device 200 includes a housing 201. The housing 201 defines an aperture 202.

As shown, the electronic device 200 may be an electronic watch. One of the watch bands is removed to expose the aperture 202, which may be a pressure port. However, it is understood that this is an example and that the electronic device 200 may be any electronic device with an aperture 202 (such as a mobile computing device, a laptop computing device, a phone, a tablet computing device, and so on) without departing from the scope of the present disclosure.

Figure 2B:
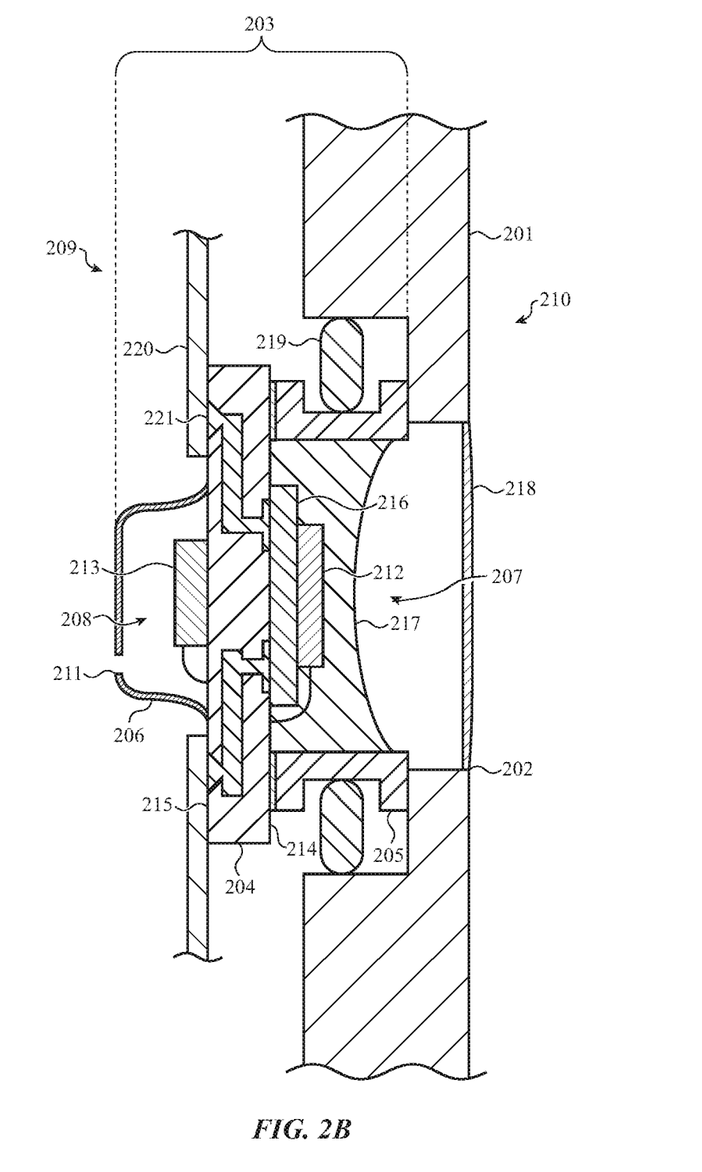
FIG. 2B depicts an example cross-section of the electronic device of FIG. 2A, taken along line B-B of FIG. 2A.

FIG. 2B depicts an example cross-section of the electronic device 200 of FIG. 2A, taken along line B-B of FIG. 2A, illustrating a pressure sensing module 203. The pressure sensing module 203 may be disposed within the housing 201. The pressure sensing module 203 may include a first housing 205 coupled to a first surface 214 of a substrate 204. The first housing 205 may define a first chamber 207. The first chamber 207 may be connected to an external environment 210 around the electronic device 200 via the aperture 202 in the housing 201.

The pressure sensing module 203 may also include a second housing 206 coupled to a second surface 215 of the substrate 204 that is opposite the first surface 214. The second housing 206 may define a second chamber 208. The second chamber 208 may define an aperture 211 and may be connected to an internal volume 209 defined by the housing 201 via the aperture 211.

The pressure sensing module 203 may be coupled to the housing 201 around the aperture 202 so as to separate and isolate the internal volume 209 from the external environment 210, and thus the first chamber 207 from the second chamber 208. For example, a seal 219 (which may be an o-ring or other sealing member) may be positioned around the first housing 205 to couple the pressure sensing module 203 to the housing 201 so as to form an air or other seal between the internal volume 209 and the external environment 210, and thus between the first chamber 207 and the second chamber 208.

A first pressure sensing element 212 may be disposed within the first chamber 207. The first pressure sensing element 212 may be mechanically coupled to the first surface 214 and electrically coupled to the substrate 204 via the first surface 214. For example, as shown, the first pressure sensing element 212 may be wire bonded or otherwise electrically connected to the first surface 214 of the substrate 204 for electrical connection and mechanically coupled to the first surface 214 via an application specific integrated circuit 216. The first pressure sensing element 212 may be operative to detect a pressure of the external environment 210.

A second pressure sensing element 213 may be disposed within the second chamber 208. The second pressure sensing element 213 may be mechanically coupled to the second surface 215 and electrically coupled to the substrate 204 via the second surface 215. For example, as shown, the first pressure sensing element 212 may be wire bonded or otherwise electrically connected to the second surface 215 of the substrate 204 for electrical connection and mechanically coupled to the second surface 215. The second pressure sensing element 213 may be operative to detect an internal pressure of the internal volume 209.

The application specific integrated circuit 216 or other integrated circuit or circuitry may be mechanically coupled to the first surface 214 and electrically coupled to the substrate 204 via the first surface 214. The application specific integrated circuit 216 may also be electrically coupled to the first pressure sensing element 212 and the second pressure sensing element 213 via the substrate 204.

For example, the substrate 204 may be a ceramic substrate with a conductor 221 (such as one or more vias) extending throughout, such as between the first surface 214 and the second surface 215 that connect to the application specific integrated circuit 216 and/or other components. The substrate 204 may also include connections for electrically connecting to the first pressure sensing element 212 and the second pressure sensing element 213, such as wire bond pads. However, it is understood that this is an example. In various examples, the substrate 204 may be a printed circuit board, a flexible printed circuit or "flex," and so on without departing from the scope of the present disclosure.

The application specific integrated circuit 216 may be operative to receive one or more signals from the first pressure sensing element 212 and the second pressure sensing element 213. The application specific integrated circuit 216 may perform signal processing on such signals. For example, the application specific integrated circuit 216 may convert the signals from analog to digital, convert the signals from digital to analog, compensate the signals for temperature, amplify the signals, and so on. As the application specific integrated circuit 216 may perform the same kind of signal processing on the same kinds of data from both the first pressure sensing element 212 and the second pressure sensing element 213, connection of the application specific integrated circuit 216 to both the first pressure sensing element 212 and the second pressure sensing element 213 may eliminate redundant components that might otherwise be used.

The application specific integrated circuit 216 may communicate the signals and/or processed signals to other components of the electronic device 200. For example, the application specific integrated circuit 216 may be electrically connected to one or more processing units or other controllers via one or more flexes 220 that are electrically connected to the application specific integrated circuit 216 via the substrate 204. Various configurations are possible and contemplated.

In some implementations, the application specific integrated circuit 216 may be a flip chip and the substrate 204 may include bonding pads for the flip chip. However, it is understood that this is an example and that any integrated circuit technology may be used to implement the application specific integrated circuit 216 and/or the electrical connections between the application specific integrated circuit 216 and the substrate 204.

Various components may also be included that isolate, seal, and/or protect one or more components of the pressure sensing module 203, various internal components positioned in the internal volume 209, and so on from contaminants in the external environment 210. For example, a gel 217 may be positioned in the first chamber 207. The gel 217 may be a silicone or other kind of gel that protects the first pressure sensing element 212, the application specific integrated circuit 216, and/or the substrate 204 against external contaminants while being deformable enough to transfer pressure changes from the external environment 210 to the first pressure sensing element 212.

Similarly, a water resistant membrane 218 and/or mesh or other structure may be positioned over the aperture 202. The water resistant membrane 218 may restrict or prevent the passage of contaminants from the external environment 210 into the first chamber 207. Such contaminants may include water, dirt, dust, oil, air, and so on. The water resistant membrane 218 may also be flexible enough to transfer pressure changes from the external environment 210 to the first pressure sensing element 212 via the first chamber 207.

The first pressure sensing element 212 and the second pressure sensing element 213 may be one or more of a variety of different pressure sensors or other pressure sensing elements. For example, one or more of the first pressure sensing element 212 and the second pressure sensing element 213 may be one or more microelectromechanical systems (MEMS) pressure sensors. For example, such a MEMS pressure sensor may include a silicon wafer (such as monocrystalline silicon, porous silicon, and so on) that defines a vacuum. In some implementations, such a MEMS pressure sensor may include a stack of a glass wafer with one or more silicon wafers defining such a vacuum, one or more oxide layers and/or other components, and so on. Alternatively, one or more of the first pressure sensing element 212 and the second pressure sensing element 213 may be one or more piezo-resistive strain gauge pressure sensing mechanisms, capacitive pressure sensing mechanisms, optical pressure sensing mechanisms, electromagnetic pressure sensing mechanisms, piezoelectric pressure sensing mechanisms, potentiometric pressure sensing mechanisms, resonant pressure sensing mechanisms, thermal pressure sensing mechanisms, ionization pressure sensing mechanisms, piezo-resistive pressure sensing mechanisms, and/or any other kind of pressure sensing mechanism without departing from the scope of the present disclosure.

Although the pressure sensing module 203 is illustrated and described as including a first housing 205 that defines the first chamber 207 and a second housing 206 that defines the second chamber 208, it is understood that this is an example. In some implementations, a single housing may define both the first chamber 207 and the second chamber 208 without departing from the scope of the present disclosure.

Further, in various implementations, the pressure sensing module 203 may omit the first housing 205 and the second housing 206. For example, in some implementations, the substrate 204 may be coupled to the housing 201 to position the first pressure sensing element 212 adjacent the aperture 202 and the second pressure sensing element 213 adjacent the internal volume 209. In such an implementation, the substrate 204 of the pressure sensing module 203 would separate and isolate the external environment 210 from the internal volume 209 and the substrate 204 and/or the housing 201 and/or the elements used for coupling would function as the first housing 205 and the second housing 206. The substrate 204 of the pressure sensing module 203 would thus define the area around the aperture 202 as the first chamber 207 and the internal volume 209 as the second chamber 208. Various configurations are possible and contemplated without departing from the scope of the present disclosure.

The pressure sensing module 203 is illustrated and described as including particular components configured in a particular arrangement. By way of illustration, the pressure sensing module 203 is illustrated and described as mechanically coupling the first pressure sensing element 212 to the first surface 214 of the substrate 204 via the application specific integrated circuit 216. However, it is understood that this is an example. Various other configurations are possible and contemplated without departing from the present disclosure.

Figure 3:
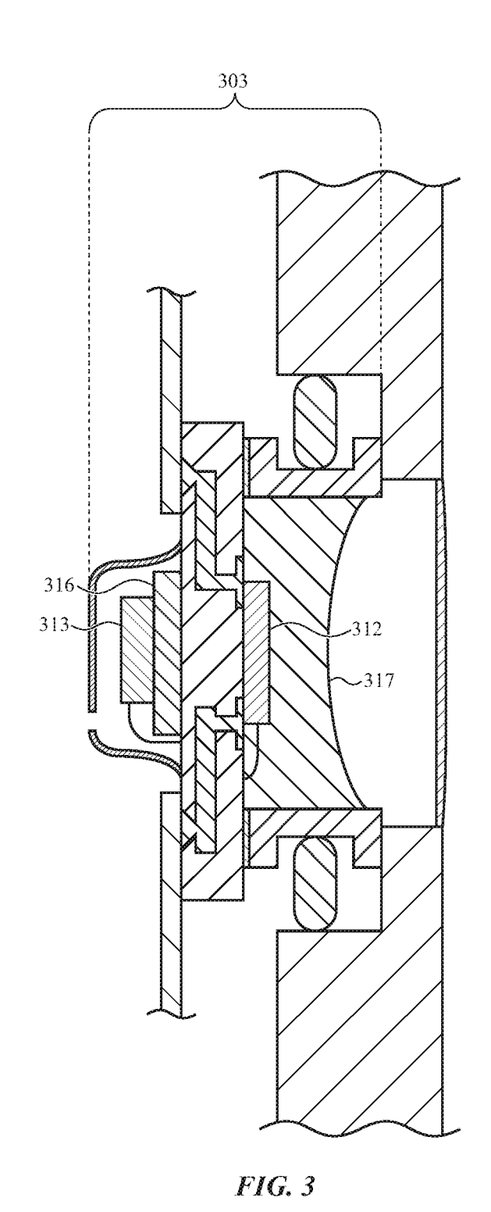
FIG. 3 depicts a first alternative implementation of the pressure sensing module of FIG. 2B.

By way of example, FIG. 3 depicts a first alternative implementation of the pressure sensing module 203 of FIG. 2B. The pressure sensing module 303 of FIG. 3 mechanically couples a second pressure sensor 313 to an application specific integrated circuit 316 instead of a first pressure sensor 312. The electrical communication between the components may function similarly to that of the pressure sensing module 203 of FIG. 2B, but the mechanical connections may thus be different.

Figure 4:
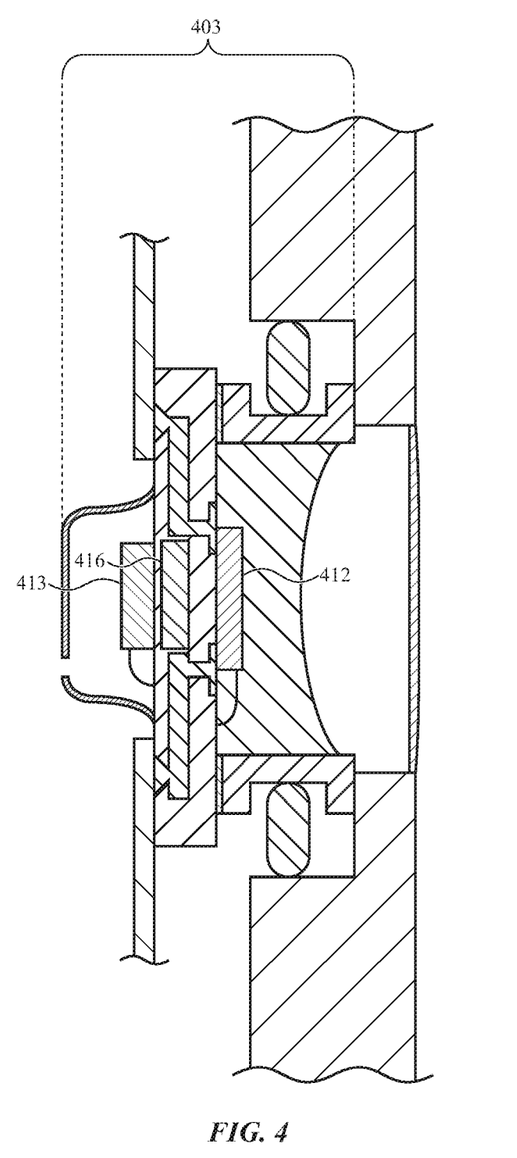
FIG. 4 depicts a second alternative implementation of the pressure sensing module of FIG. 2B.

By way of another example, FIG. 4 depicts a second alternative implementation of the pressure sensing module 203 of FIG. 2B. The pressure sensing module 403 of FIG. 4 may use an embedded application specific integrated circuit 416. In this way, the electrical communication between the components may be similar but neither a first pressure sensing element 412 nor a second pressure sensing element 413 may be directly mechanically coupled to the application specific integrated circuit 416.

Figure 5:
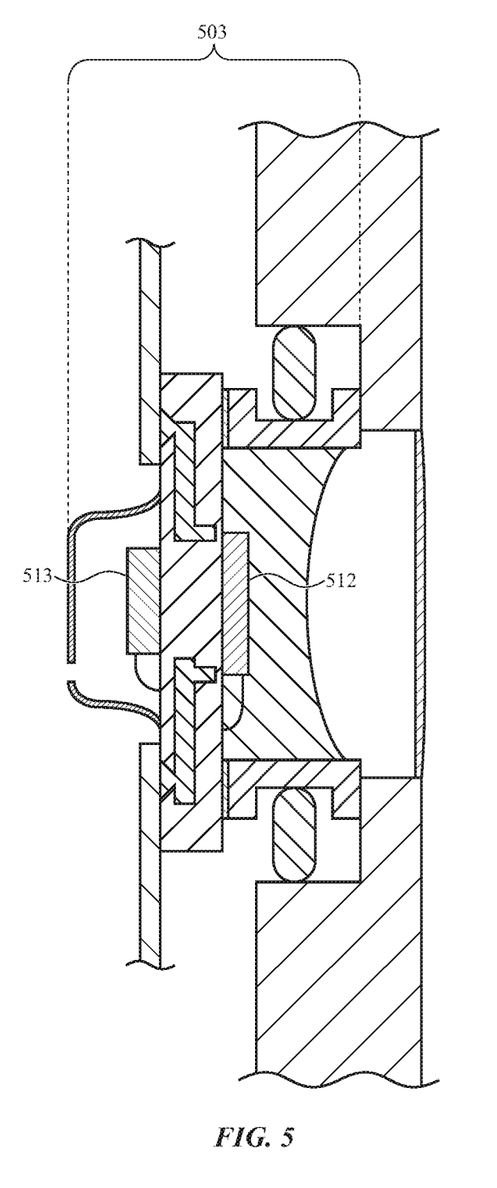
FIG. 5 depicts a third alternative implementation of the pressure sensing module of FIG. 2B.

By way of still another example, FIG. 5 depicts a third alternative implementation of the pressure sensing module 203 of FIG. 2B. The pressure sensing module 503 of FIG. 5 may omit an application specific integrated circuit. Instead, signals from a first pressure sensing element 512 and/or a second pressure sensing element 513 may be used directly by one or more other components, such as a processing unit or other controller.

Figure 6:
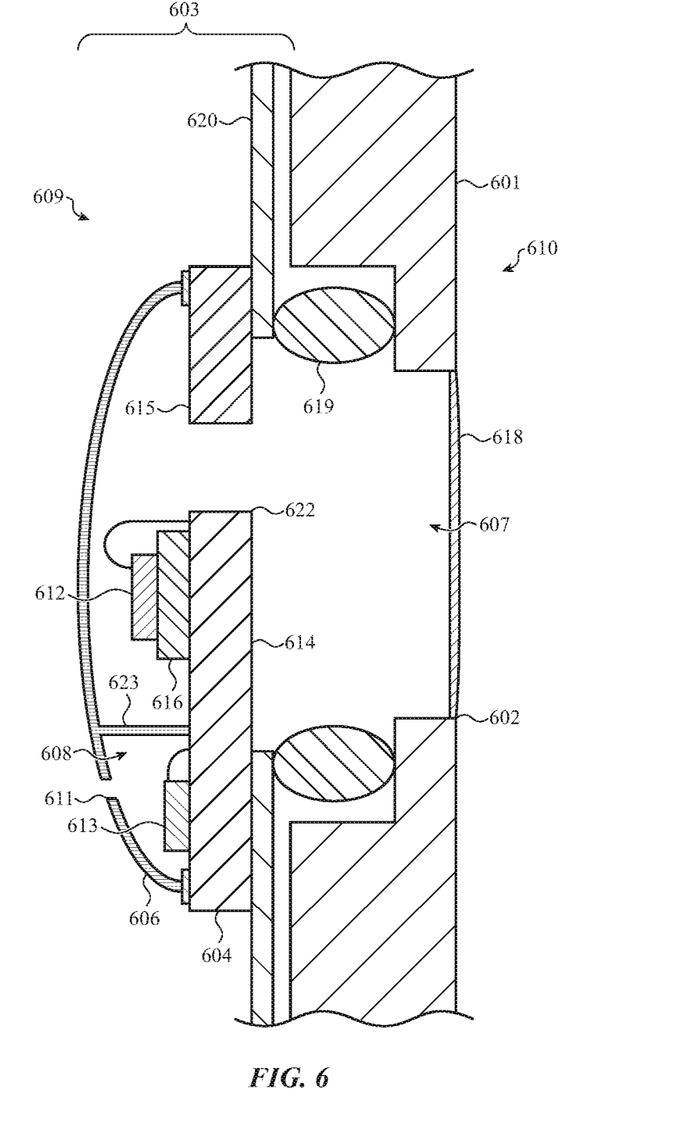
FIG. 6 depicts a fourth alternative implementation of the pressure sensing module of FIG. 2B.

FIG. 6 depicts a fourth alternative implementation of the pressure sensing module 203 of FIG. 2B. By way of contrast with the pressure sensing module 203 of FIG. 2B, the pressure sensing module 603 may include a first pressure sensing element 612 and a second pressure sensing element 613 that are both coupled to the same surface 615 of a substrate 604.

The pressure sensing module 603 may be coupled around an aperture 602 in a housing 601 using a seal 619. The pressure sensing module 603 may include a housing 606 that is coupled to the surface 615 and defining a first chamber 607 and a second chamber 608. The first pressure sensing element 612 may be disposed within the first chamber 607 and be operative to detect a pressure of a first environment 610. The second pressure sensing element 613 may be disposed within the second chamber 608 and be operative to detect a pressure of a second environment 609.

The housing 606 may include a wall 623 or other structure coupled to the surface 615 that separates and isolates the first chamber 607 from the second chamber 608. The substrate 604 may define a passage 622 through the substrate 604 from the surface 615 to an opposite surface 614. This passage 622 may connect the first pressure sensing element 612 to the aperture 602, allowing the first chamber 607 to extend across the substrate 604. This may also allow the first pressure sensing element 612 to be coupled to the surface 615 of the substrate 604 opposite from the aperture 602 without separating the first pressure sensing element 612 from the first environment 610.

The housing 606 is shown as having a first surface where the housing 606 is coupled to the surface 615 and a second surface opposite the first surface where the housing 606 defines an aperture 611. The aperture 611 may connect the second chamber 608 to the second environment 609.

In some implementations, the dimensions of the aperture 611 may be deliberately small such that pressure changes in the second environment 609 cause a greater change in the second chamber 608 (and thus more easily detectible by the second pressure sensing element 613) than if the aperture 611 was larger. In other implementations, the housing 606 may be omitted where the second pressure sensing element 613 is beyond the wall 623, making the entire second environment 609 the second chamber 608. Various configurations are possible and contemplated without departing from the scope of the present disclosure.

Further, similar to the pressure sensing module 203 of FIG. 2B, the pressure sensing module 603 may include a water resistant membrane 618 coupled to the aperture 602, an application specific integrated circuit 616 or other integrated circuit electrically coupled to the first pressure sensing element 612 and the second pressure sensing element 613 via the substrate 604, and one or more flex circuits 620 that may electrically couple the application specific integrated circuit 616 to various other components. Various configurations are possible and contemplated without departing from the scope of the present disclosure.

In this example, the first environment 610 may be an external environment and the second environment 609 may be an internal volume. However, it is understood that this is an example. In other implementations, the external environment and internal volume could be swapped without departing from the scope of the present disclosure. In such an implementation, the orientation of the pressure sensing module 603 may be flipped.

The pressure sensing module 603 is illustrated and described as mechanically coupling the first pressure sensing element 612 to the surface 614 via the application specific integrated circuit 616. However, it is understood that this is an example. Other configurations are possible and contemplated without departing from the scope of the present disclosure.

Figure 7:
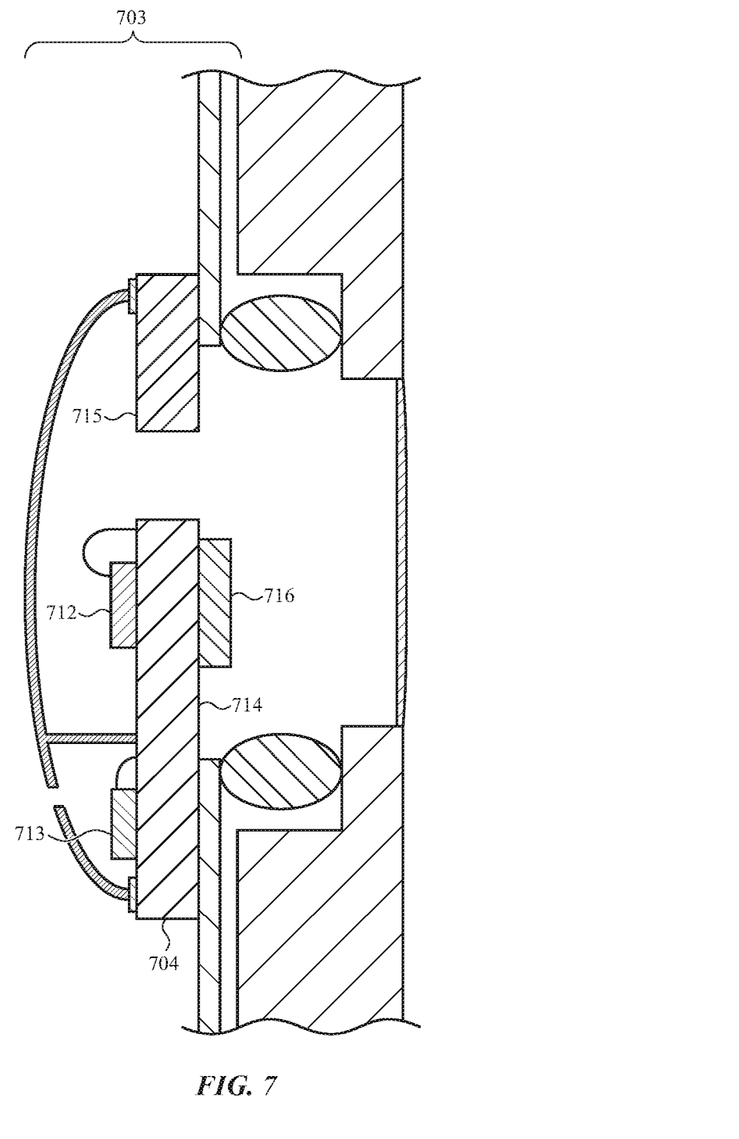
FIG. 7 depicts a first alternative implementation of the pressure sensing module of FIG. 6.

By way of example, FIG. 7 depicts a first alternative implementation of the pressure sensing module 603 of FIG. 6. In the pressure sensing module 703, a first pressure sensing element 712 and a second pressure sensing element 713 may be directly electrically and mechanically coupled to a surface 715 of a substrate 704. An application specific integrated circuit 716 may be electrically and mechanically coupled to an opposite surface 714 of the substrate 704.

Figure 8:
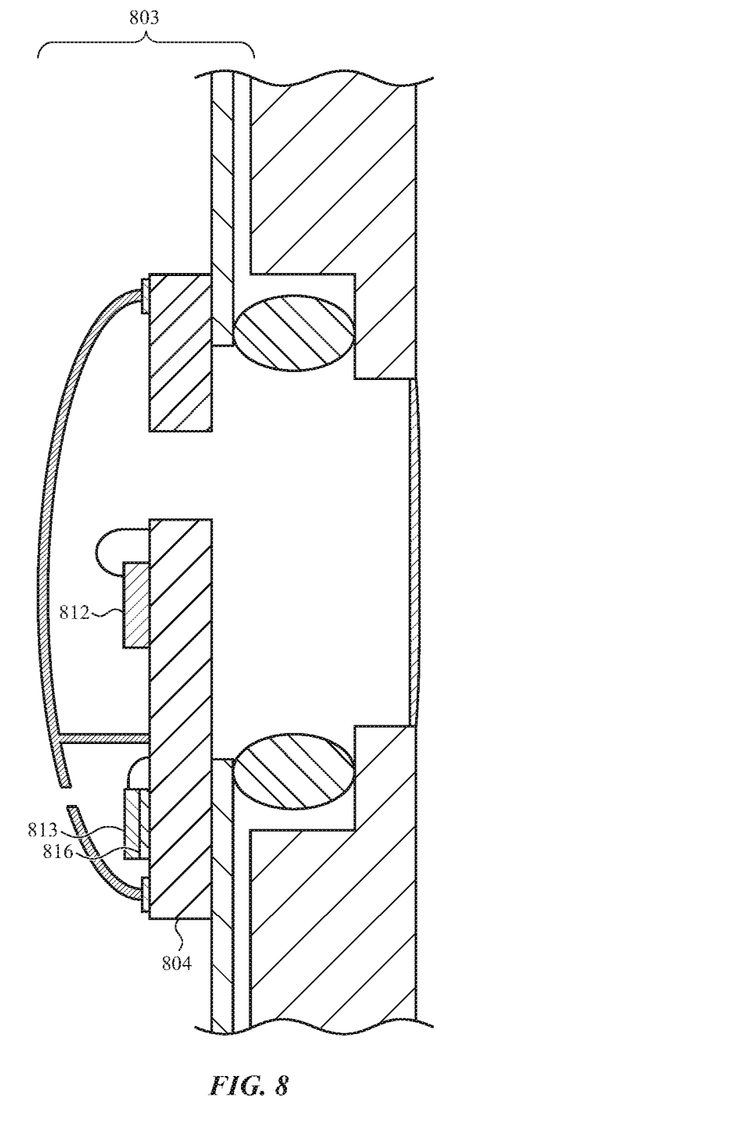
FIG. 8 depicts a second alternative implementation of the pressure sensing module of FIG. 6.

By way of another example, FIG. 8 depicts a second alternative implementation of the pressure sensing module 603 of FIG. 6. In the pressure sensing module 803, a first pressure sensing element 812 may be directly coupled to a substrate 804. An application specific integrated circuit 816 may couple a second pressure sensing element 813 to the substrate 804. In other implementations, the application specific integrated circuit 816 may be omitted entirely.

Figure 9:
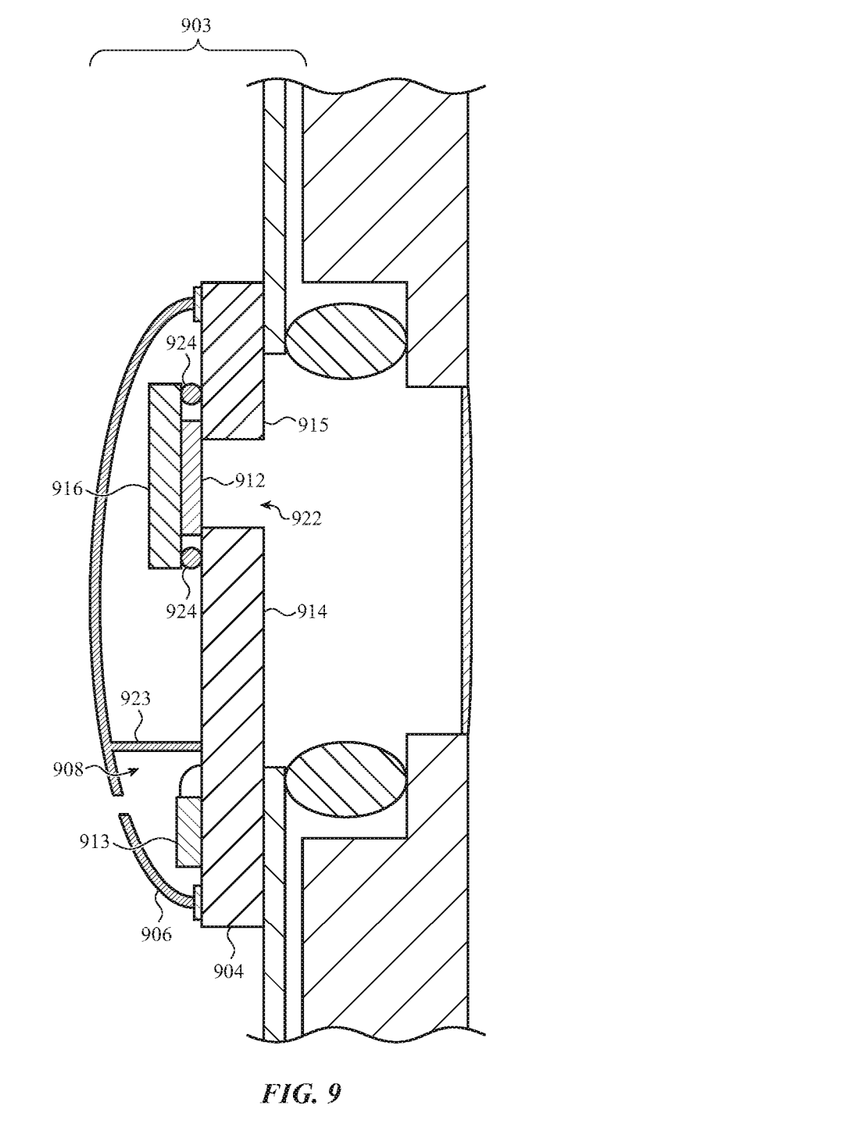
FIG. 9 depicts a third alternative implementation of the pressure sensing module of FIG. 6.

In still another example, FIG. 9 depicts a third alternative implementation of the pressure sensing module 603 of FIG. 6. In the pressure sensing module 903, an application specific integrated circuit 916 may be coupled to a surface 915 of a substrate 904 via solder balls 924 or other electrical and/or mechanical connections. The application specific integrated circuit 916 may be coupled over a passage 922 defined in the substrate 904 that extends through the substrate 904 from the surface 915 to an opposite surface 914. A first pressure sensing element 912 may be coupled to the application specific integrated circuit 916 over the passage 922. A second pressure sensing element 913 may be coupled to the surface 915 in a chamber 908 defined by a housing 906 and a wall 923.

Figure 10:
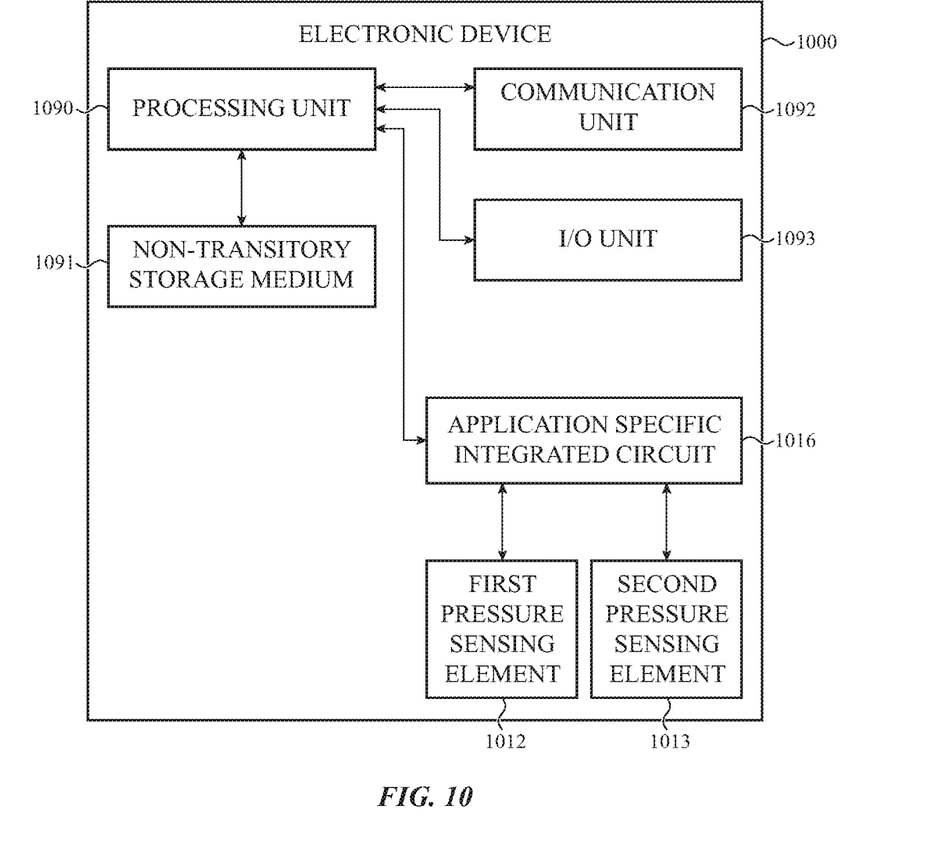
FIG. 10 depicts a block diagram illustrating example components and functional relationships therebetween that may be implemented in an electronic device such as the electronic devices of FIGS. 1A and 2A.

FIG. 10 depicts a block diagram illustrating example components and functional relationships therebetween that may be implemented in an electronic device 1000 such as the electronic devices 100, 200 of FIGS. 1A and 2A. The electronic device 1000 may include one or more processing units 1090 and/or other processors or controllers, non-transitory storage media 1091 (which may take the form of, but is not limited to, a magnetic storage medium; optical storage medium; magneto-optical storage medium; read only memory; random access memory; erasable programmable memory; flash memory; and so on), communication units 1092, input/output units 1093, and so on. The electronic device 1000 may also include an application specific integrated circuit 1016 or other integrated circuit, a first pressure sensing element 1012, and a second pressure sensing element 1013. The application specific integrated circuit 1016, the first pressure sensing element 1012, and the second pressure sensing element 1013 may be components of a pressure sensing module, such as the pressure sensing modules 103, 203, 303, 403, 503, 603, 703, 803, 903 of FIGS. 1B-9.

The processing unit 1090 may execute instructions stored in the non-transitory storage medium 1091 to perform various functions. For example, the processing unit 1090 may use the application specific integrated circuit 1016, the first pressure sensing element 1012, and/or the second pressure sensing element 1013 to determine a pressure of an external environment and/or a pressure of an internal volume defined by a housing of the electronic device 1000. Various configurations are possible and contemplated without departing from the scope of the present disclosure.

Figure 11:
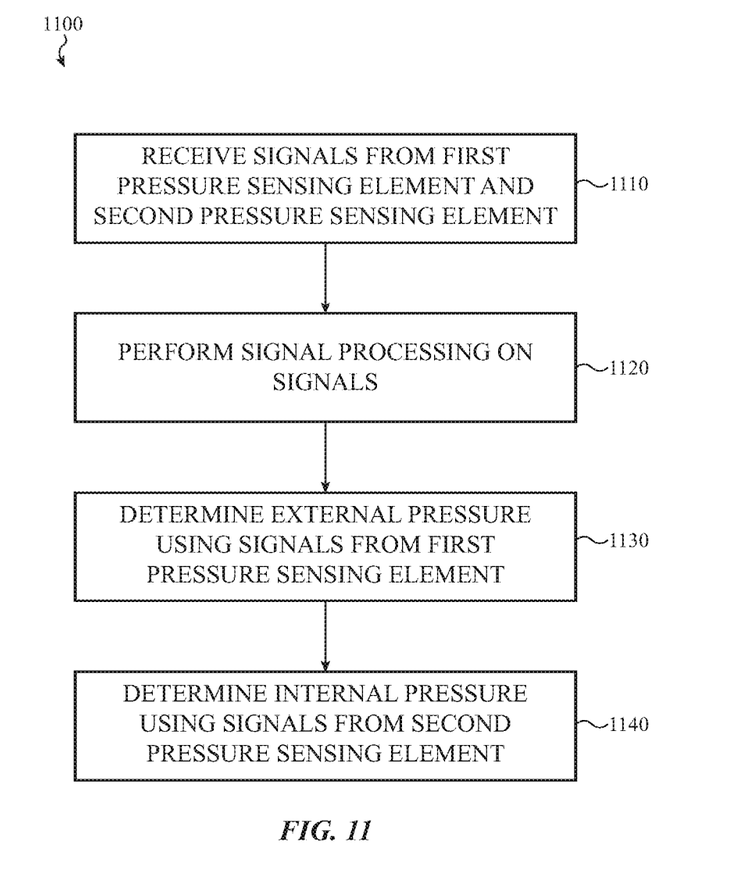
FIG. 11 is a flow chart illustrating a method for operating an electronic device having a dual pressure sensing module with a shared electrical substrate. This method may be performed by the electronic devices of FIGS. 1A and 2A.

FIG. 11 is a flow chart illustrating a method 1100 for operating an electronic device having a dual pressure sensing module with a shared electrical substrate. This method 1100 may be performed by the electronic devices 100, 200 of FIGS. 1A and 2A.

At 1110, an electronic device may receive signals from a first pressure sensing element and a second pressure sensing element. The first pressure sensing element may be operative to detect a pressure in a first chamber and the second pressure sensing element may be operative to detect a pressure in a second chamber. The first chamber may be connected to an external environment around the electronic device. The second chamber may be connected to an internal volume defined by the electronic device.

At 1120, the electronic device may perform signal processing on one or more of the signals. This signal processing may include converting the signals from analog to digital, converting the signals from digital to analog, compensating the signals for temperature, amplifying the signals, and so on.

At 1130, the electronic device may determine or estimate an external pressure using the signals from the first pressure sensing element and/or the processed signals from the first pressure sensing element. For example, the electronic device may use the external pressure in health information calculations.

At 1140, the electronic device may determine or estimate an internal pressure of the electronic device using the signals from the second pressure sensing element and/or the processed signals from the second pressure sensing element. For example, the electronic device may use the internal pressure to determine or estimate when force exerted on a cover glass causes fluctuations in the internal pressure of the internal volume.

Although the example method 1100 is illustrated and described as including particular operations performed in a particular order, it is understood that this is an example. In various implementations, various orders of the same, similar, and/or different operations may be performed without departing from the scope of the present disclosure.

For example, the method 1100 is illustrated and described as determining or estimating both external pressure and internal pressure. However, in various situations, the electronic device may determine one of the external or internal pressure without determining the other. Various configurations are possible and contemplated without departing from the scope of the present disclosure.

As described above and illustrated in the accompanying figures, the present disclosure relates to a dual pressure sensing module with a shared electrical substrate. The module includes a substrate and at least one module housing coupled to the substrate. The at least one module housing defines a first chamber and a second chamber. The second chamber is separate from the first chamber. The first chamber is configured to connect to an environment around an electronic device. The second chamber is configured to connect to an internal volume of the housing of the electronic device. A first pressure sensing element is electrically coupled to the substrate and disposed in the first chamber and is operative to detect an external pressure around the electronic device. A second pressure sensing element is electrically coupled to the substrate and disposed in the second chamber and is operative to detect an internal pressure within the electronic device housing. In this way, a single module is operative to detect external and internal pressure while sharing an electrical substrate and keeping the external and internal pressures separate.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
an electronic device housing defining an aperture;
a pressure sensing module coupled to the electronic device housing around the aperture, the pressure sensing module comprising:
a substrate;
at least one module housing coupled to the substrate that defines:
a first chamber connected to the aperture;
a second chamber separate from the first chamber;
a first pressure sensing element, electrically coupled to the substrate and disposed in the first chamber, operative to detect an external pressure around the electronic device; and
a second pressure sensing element, electrically coupled to the substrate and disposed in the second chamber, operative to detect an internal pressure within the electronic device housing; and
a water resistant membrane, coupled to the at least one module housing and separated from the first pressure sensing element by the first chamber.

2. The electronic device of claim 1, further comprising gel positioned in the first chamber.

3. The electronic device of claim 2, wherein the water resistant membrane is separated from the gel by the first chamber.

4. The electronic device of claim 1, wherein the first pressure sensing element and the second pressure sensing element are microelectromechanical system pressure sensors.

5. The electronic device of claim 1, further comprising a seal positioned between the electronic device housing and the at least one module housing around the first chamber.

6. An electronic device, comprising:
an electronic device housing defining an aperture;
a pressure sensing module coupled to the electronic device housing around the aperture, the pressure sensing module comprising:
   a substrate;
   at least one module housing coupled to the substrate that defines:
      a first chamber connected to the aperture; and
      a second chamber separate from the first chamber;
   a first pressure sensing element, electrically coupled to the substrate and disposed in the first chamber, operative to detect an external pressure around the electronic device; and
   a second pressure sensing element, electrically coupled to the substrate and disposed in the second chamber, operative to detect an internal pressure within the electronic device housing; and
a seal, positioned between the electronic device housing and the at least one module housing around the first chamber, that
separates the second chamber from an external environment around the electronic device.

7. The electronic device of claim 6, wherein:
the substrate has a first surface and a second surface opposing the first surface;
the at least one module housing comprises a first housing coupled to the first surface and a second housing coupled to the second surface, the first housing defining the first chamber and the second housing defining the second chamber.

8. The electronic device of claim 7, further comprising an integrated circuit, coupled to the substrate, that processes signals from the first pressure sensing element and the second pressure sensing element.

9. The electronic device of claim 8, wherein:
the integrated circuit is coupled to the first surface; and
the first pressure sensing element is coupled to the first surface via the integrated circuit.

10. The electronic device of claim 8, wherein:
the integrated circuit is coupled to the second surface; and
the second pressure sensing element is coupled to the first surface via the integrated circuit.

11. The electronic device of claim 8, wherein the integrated circuit is configured to at least:
convert the signals from analog to digital;
compensate the signals for temperature; or
amplify the signals.

12. The electronic device of claim 7, wherein the substrate:
includes a conductor that extends from the first surface to the second surface; or comprises ceramic.

13. The electronic device of claim 6, further comprising a water resistant membrane, coupled to the at least one module housing and separated from the first pressure sensing element by the first chamber.

14. A pressure sensing module for an electronic device, comprising:
a substrate having a surface and defining a passage through the substrate;
a housing coupled to the surface to define:
   a first chamber configured to be connected to a first environment via the passage; and
   a second chamber configured to be connected to a second environment;
a first pressure sensing element, coupled to the surface, operative to detect a first pressure of the first environment;
a second pressure sensing element, coupled to the surface, operative to detect a second pressure of the second environment; and
a water resistant membrane, coupled to the housing and separated from the first pressure sensing element by the first chamber.

15. The pressure sensing module of claim 14, wherein the housing defines an aperture that connects the second chamber to the second environment.

16. The pressure sensing module of claim 14, wherein the housing includes a wall, coupled to the surface, that separates the first chamber from the second chamber.

17. The pressure sensing module of claim 14, wherein the housing:
has a first surface that couples to the surface of the substrate;
has a second surface opposite the first surface; and
defines an aperture in the second surface that is configured to connect the second chamber to the second environment.

18. The pressure sensing module of claim 14, wherein the first pressure sensing element is positioned over the passage.

19. The pressure sensing module of claim 18, further comprising an integrated circuit, coupled to the surface over the first pressure sensing element, that is electrically connected to the first pressure sensing element and the second pressure sensing element.

20. The pressure sensing module of claim 14, wherein:
the surface is a first surface;
the substrate includes a second surface opposite the first surface; and
the pressure sensing module further comprises an integrated circuit, coupled to the second surface, that is electrically connected to the first pressure sensing element and the second pressure sensing element.

* * * * *